(12) United States Patent
Song et al.

(10) Patent No.: US 6,945,406 B2
(45) Date of Patent: Sep. 20, 2005

(54) TAPE CARRIER PACKAGE FILM

(75) Inventors: Hong-Sung Song, Kyungsangbuk-do (KR); Sung-Woong Moon, Kyungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 331 days.

(21) Appl. No.: 09/785,423

(22) Filed: Feb. 20, 2001

(65) Prior Publication Data
US 2001/0024259 A1 Sep. 27, 2001

(30) Foreign Application Priority Data
Feb. 21, 2000 (KR) .......................................... 2000-8303

(51) Int. Cl.⁷ .............................................. B65D 85/90
(52) U.S. Cl. ..................... 206/714; 206/713; 206/813
(58) Field of Search ................. 206/713–717, 206/701, 722–728, 564–565, 820

(56) References Cited
U.S. PATENT DOCUMENTS

| | | | | |
|---|---|---|---|---|
| 4,118,859 A | * | 10/1978 | Busler | 29/622 |
| 4,702,370 A | * | 10/1987 | Honda | 206/714 |
| 5,119,934 A | * | 6/1992 | Karasawa et al. | 206/714 |
| 5,360,110 A | * | 11/1994 | Hirai et al. | 206/714 |
| 5,524,765 A | * | 6/1996 | Gutentag | 206/713 |
| 6,076,681 A | * | 6/2000 | Chenoweth | 206/714 |
| 6,297,964 B1 | * | 10/2001 | Hashimoto | 361/760 |
| 6,467,627 B1 | * | 10/2002 | Troxtell, Jr. | 206/714 |

* cited by examiner

Primary Examiner—Jila M. Mohandesi
(74) Attorney, Agent, or Firm—McKenna Long & Aldridge LLP

(57) ABSTRACT

A tape carrier package (TCP) film for use with liquid crystal displays. The tape carrier package (TCP) film includes depressions and punch holes that enable fast, efficient separation of a tape carrier part, which includes driving integrated circuits, from a peripheral part. The tape carrier part has an "I" shape that is formed by depressions. Punching holes are provided along the depressions to reduce the length of the connection between the tape carrier package part and the peripheral part. The peripheral part includes a plurality of sprocket holes along the edges of the tape carrier package film.

17 Claims, 3 Drawing Sheets

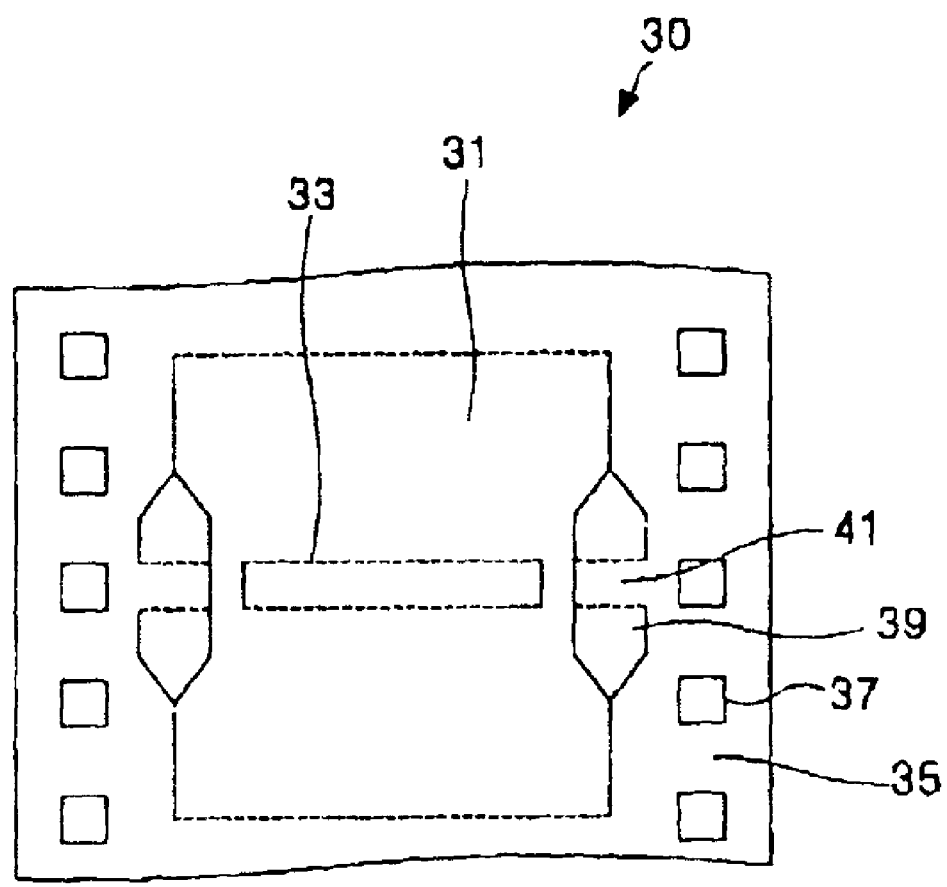

TAPE CARRIER PACKAGE FILM

This application claims the benefit of Korean Patent Application No. 2000-8303, filed on Feb. 21, 2000, which is hereby incorporated by reference for all purposes as if fully set forth herein.

BACKGROUND OF THE INVENTION

1. Field of the Invention

The present invention relates to a tape carrier package (TCP) film used for fabricating a liquid crystal display. More particularly, the present invention relates to a TCP film having an enhanced mounting efficiency.

2. Discussion of the Related Art

Generally, a liquid crystal display (LCD) controls the light transmissivity of a matrix array of liquid crystal cells so as to produce a picture that corresponds to input video signals. In general, a LCD includes a liquid crystal display panel comprised of active matrix liquid crystal cells and driving integrated circuits (ICs) for driving the liquid crystal cells.

The driving ICs are usually manufactured in chip form and are supplied on a tape carrier package. The driving ICs are subsequently mounted using a tape automated bonding (TAB) system. During mounting, one end of the TCP is electrically connected to pads formed along the edges of the liquid crystal display panel, while the other end is electrically connected to an external printed circuit board (PCB). The pads electrically connect to the liquid crystal cells within the liquid crystal display panel. Thus, signals from the PCB are applied to the driving ICs, which then drive the individual liquid crystal cells.

As the resolution of the LCD increases, so does the number of liquid crystal cells, electrode lines, and pads. Therefore, either the number of TCPs must increase, or the number of pads per TCP must increase.

FIG. 1 is a plan view showing a structure of a conventional TCP film. As shown, the TCP film 10 consists of an "I" shaped TCP part 11 and a peripheral part 15. The TCP part 11 includes a mounting portion 13 for receiving a driving IC chip. The mounting portion 13 also includes conductors for passing signals to and from the driving IC chip mounted on the mounting portion 13. The peripheral part 15 has sprocket holes 17 formed along the sides of the TCP film 10. The sprocket holes 17 enable a tape carrier (not shown) to advance the TCP film 10 into position during assembly of the liquid crystal display (LCD).

The TCP film 10 is eventually separated into the TCP part 11 and the peripheral part 15. In practice, the TCP film 10 is punched along a depression line to separate the peripheral part 15 from the TCP part 11. However, the conventional TCP film has a problem in that, since the shape of the TCP part is relatively complex, punching can be difficult and time consuming.

SUMMARY OF THE INVENTION

Accordingly, the present invention is directed to a tape carrier package (TCP) film that substantially obviates one or more of the problems due to limitations and disadvantages of the related art.

An object of the present invention is to provide a TCP film that enables easy and rapid punching of the TCP part.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a tape carrier package film according to the present invention includes an I-shaped tape carrier package part defined by depressions. The TCP part includes a mounting portion mounted with a driving IC on conductive patterns. The conductors extend from the mounting portion to sides of the TCP part to enable delivery of signals to and from the driving IC. Also included is a peripheral part having a plurality of sprocket holes. A plurality of punching holes is provided along the depression formed border between the tape carrier package part and the peripheral part. The punching holes reduce the strength of the connection between the tape carrier package part and the peripheral part.

It is to be understood that both the foregoing general description and the following detailed description are only exemplary and explanatory of the invention as claimed.

BRIEF DESCRIPTION OF THE DRAWING

The accompanying drawings, which are included to provide a further understanding of the invention are incorporated in and constitute a part of this specification, illustrate embodiments of the invention and together with the description serve to explain the principles of the invention.

In the drawings:

FIG. 3 is a plan view showing a structure of a tape carrier package film according to another embodiment of the present invention.

DETAILED DESCRIPTION OF THE ILLUSTRATED EMBODIMENTS

Reference will now be made in detail to illustrated embodiments of the present invention, examples of which are shown in the accompanying drawings.

Figure 1:
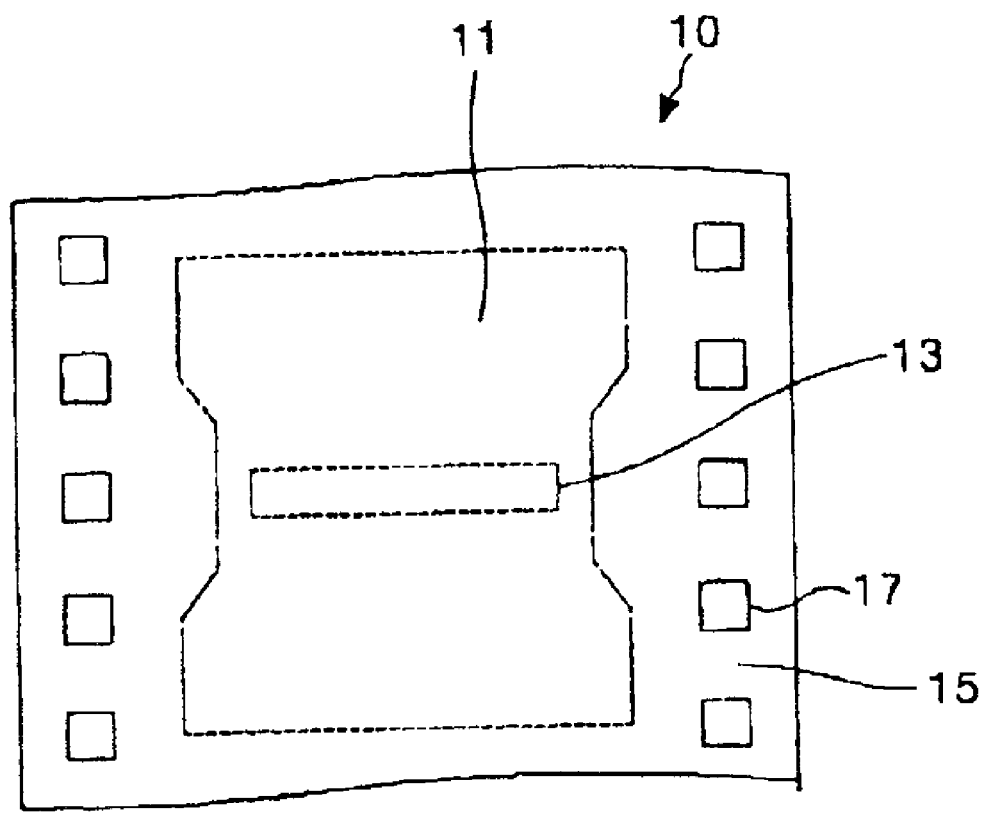
FIG. 1 is a plan view showing a structure of a conventional tape carrier package film.
Figure 2:
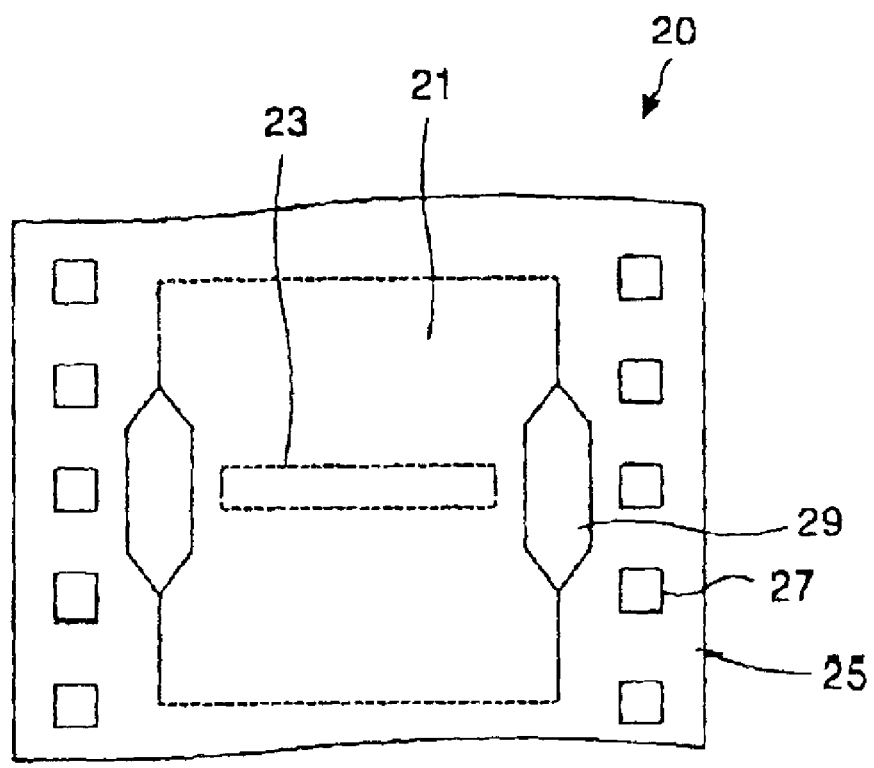
FIG. 2 is a plan view showing a structure of a tape carrier package film according to an embodiment of the present invention.

Referring to FIG. 2, there is shown a flexible tape carrier package (TCP) film 20 according to a first embodiment of the present invention. The TCP film 20 consists of a TCP part 21, a peripheral part 25, and elongated punching holes 29.

The TCP part 21 includes a mounting portion 23 mounted with a driving ICs (or with multiple ICs). The TCP part 21 includes conductors (not shown) for delivering signals to and from the driving IC(s) mounted on the mounting portion 23. The TCP part 21 is defined by depressions that form the TCP part 21 into an "I" shape.

The peripheral part 25 secures the TCP part 21. Along the edges of the peripheral part 25 are a plurality of sprocket holes 27. The sprocket holes 27 are used to mechanically connect the TCP film 20 to a tape carrier (not shown) assembly device.

The punching holes 29 are defined at predetermined positions along the depression that separates the TCP part 21 from the peripheral part 25. The punching holes 29 reduce the length of the connection between the TCP part 21 and the peripheral part 25. With a driving IC (or ICs) mounted on the mounting part 23, the TCP part 21 is eventually separated from the peripheral part 25 using a die. The die face that punches out the TCP part 21 aligns with the center of the punching hole 29 and the depression. The reduced cut-away area makes the separation easier and faster.

Referring to FIG. 3, there is shown a tape carrier package (TCP) film according to a second embodiment of the present invention. The TCP film 30 consists of a TCP part 31, including a mounting part 33 mounted with a driving IC (or ICs), a peripheral part 35 having sprocket holes 37, a plurality of punching holes 39, and supporters 41 between sides of the TCP part 31 and the peripheral part 35.

As shown, the TCP part 31 is defined by a depression and by the punching holes 39. The punching holes on each side are spaced apart from each other, and the supporters 41 are between the spaced apart punching holes 39. The supporters connect the sides of the TCP part 31 to the peripheral part 35 and prevent the TCP part 31 from hanging down.

The TCP film 30 can be separated into its TCP part 31 and its peripheral part 35 by one punch. In this case, the die face that separates the peripheral part 35 from the TCP part 31 cuts along the centers of the punching holes 39 and along the supporters 41.

As previously described, the sides of the TCP part includes depressions that define the TCP part with an "I" shape. Punching holes are defined along the depression. Accordingly, punch separating the TCP part from the peripheral part along the depression is fast and easy.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. A tape carrier package film for a liquid crystal display, comprising:
    a tape carrier package part having a mounting portion for a driving integrated circuit, wherein the tape carrier package part is defined by depressions;
    a peripheral part for securing the tape carrier package part, said peripheral part having a plurality of sprocket holes; and
    a plurality of punching holes formed by cutting a part of the tape carrier package part and a part of the peripheral for reducing a connection between the tape carrier package part and the peripheral part.

2. The tape carrier package film as claimed in claim 1, wherein said punching holes are aligned with the depressions.

3. The tape carrier package film as claimed in claim 1, wherein one of the punching holes is one of a plurality of punching holes that are spaced apart from each other along a side of the tape carrier package part.

4. The tape carrier package film as claimed in claim 3, further including a supporter between punching holes for connecting the tape carrier package part to the peripheral part.

5. A tape carrier package film, comprising:
    a peripheral part having sprocket holes; and
    a tape carrier package part on the package film defined by depressions, said tape carrier package part having a mounting portion for receiving an integrated circuit;
    wherein a plurality of punching holes are formed along a border of the tape carrier package part and the peripheral part, the punching holes assisting separation of the tape carrier package part from the peripheral part.

6. A tape carrier package film according to claim 5, wherein said punching holes are elongated.

7. A tape carrier package film according to claim 6, wherein elongation axes of said punching holes align with the depressions.

8. A tape carrier package film according to claim 7, wherein a punching hole includes a triangular shaped portion.

9. A tape carrier package film according to claim 5, wherein a plurality of punching holes are provided along a side of said tape carrier package part.

10. A tape carrier package film according to claim 9, wherein a supporter is disposed between punching holes.

11. A tape carrier package film according to claim 10, wherein said supporter supports the tape carrier package part.

12. A tape carrier package film according to claim 11, wherein the tape carrier package film is flexible.

13. A tape carrier package film according to claim 5, wherein said mounting portion mounts an integrated circuit.

14. A tape carrier package film according to claim 13, wherein said mounting portion mounts a plurality of integrated circuits.

15. A tape carrier package film according to claim 5, wherein said tape carrier package film is dimensioned to integrate with a tape assembly system.

16. A tape carrier package film according to claim 15, wherein said tape assembly system is automated.

17. A tape carrier package film according to claim 15, wherein said sprocket holes are for mechanically driving the tape carrier package film by said tape assembly system.

* * * * *